(12) United States Patent
Teunissen et al.

(10) Patent No.: US 7,248,337 B2
(45) Date of Patent: Jul. 24, 2007

(54) LITHOGRAPHIC APPARATUS, LEVEL SENSOR, METHOD OF INSPECTION, DEVICE MANUFACTURING METHOD, AND DEVICE MANUFACTURED THEREBY

(75) Inventors: Paulus Antonius Andreas Teunissen, Eindhoven (NL); Petrus Johannes Maria Broodbakker, Eindhoven (NL); Rene Marinus Gerardus Johan Queens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 180 days.

(21) Appl. No.: 10/756,841

(22) Filed: Jan. 14, 2004

(65) Prior Publication Data

US 2004/0165169 A1 Aug. 26, 2004

(30) Foreign Application Priority Data

Jan. 14, 2003 (EP) .................................. 03075118

(51) Int. Cl.
 *G03B 27/54* (2006.01)
 *G03B 27/42* (2006.01)
 *G02B 7/04* (2006.01)
 *G03B 27/58* (2006.01)

(52) U.S. Cl. ............................ 355/67; 355/53; 355/72; 250/201.2

(58) Field of Classification Search ................ 355/67, 355/53, 72, 75; 250/492.1, 201.2; 359/619; 349/124
See application file for complete search history.

(56) References Cited

U.S. PATENT DOCUMENTS 3,360,324 A 12/1967 Hora
4,558,949 A 12/1985 Uehara et al.
5,229,872 A 7/1993 Mumola
5,296,891 A 3/1994 Vogt et al.
5,323,016 A 6/1994 Yamada et al.
5,523,193 A 6/1996 Nelson
5,969,441 A 10/1999 Loopstra et al.
5,985,495 A 11/1999 Okumura et al.
6,046,792 A 4/2000 Van Der Werf et al.
6,191,429 B1 2/2001 Suwa
6,195,154 B1 2/2001 Imai
6,400,441 B1 6/2002 Nishi et al.
2002/0000520 A1* 1/2002 Kawaguchi .............. 250/492.1

(Continued)

FOREIGN PATENT DOCUMENTS

EP 1 037 117 A2 9/2000

(Continued)

OTHER PUBLICATIONS

European Search Report dated Dec. 19, 2003.

(Continued)

*Primary Examiner*—Peter B. Kim
(74) *Attorney, Agent, or Firm*—Pillsbury Winthrop Shaw Pittman, LLP

(57) ABSTRACT

A level sensor for a lithographic projection apparatus according to one embodiment of the invention includes a light source, a first reflector, a second reflector and a detector. The first reflector is positioned to direct light from the light source towards a wafer surface, and the second reflector is positioned to direct light reflected from the wafer surface to the detector. The first and second reflectors are selected to incur a minimal process dependent apparent surface depression.

24 Claims, 9 Drawing Sheets

U.S. PATENT DOCUMENTS

2002/0036762 A1 3/2002 Nishi
2003/0090804 A1* 5/2003 Kotchick .................... 359/619
2004/0000627 A1* 1/2004 Schuster ................. 250/201.2

FOREIGN PATENT DOCUMENTS

| EP | 1 162 483 A2 | 12/2001 |
| EP | 1 170 636 A2 | 1/2002 |
| EP | 1 357 435 A1 | 10/2003 |
| JP | 1-303721 A | 12/1989 |
| JP | 5-166703 A | 7/1993 |
| JP | 2001-296105 A | 10/2001 |
| WO | WO 98/33906 | 7/1998 |
| WO | WO 98/38597 | 9/1998 |
| WO | WO 98/40791 | 9/1998 |

OTHER PUBLICATIONS

English language translation of Japanese Office Action dated Aug. 19, 2005.
Goos et al., "A new and fundamental experiment on total reflection", Ann. Phys. 1 (6), pp. 333-346 (1947).

* cited by examiner

LITHOGRAPHIC APPARATUS, LEVEL SENSOR, METHOD OF INSPECTION, DEVICE MANUFACTURING METHOD, AND DEVICE MANUFACTURED THEREBY

RELATED APPLICATIONS

This application claims priority to European Patent Application EP 03075118.4, filed Jan. 14, 2003, which document is herein incorporated by reference.

FIELD OF THE INVENTION

The present invention relates to lithographic apparatus and methods.

BACKGROUND

The term "patterning structure" as here employed should be broadly interpreted as referring to any structure or field that may be used to endow an incoming radiation beam with a patterned cross-section, corresponding to a pattern that is to be created in a target portion of a substrate; the term "light valve" can also be used in this context. It should be appreciated that the pattern "displayed" on the patterning structure may differ substantially from the pattern eventually transferred to e.g. a substrate or layer thereof (e.g. where pre-biasing of features, optical proximity correction features, phase and/or polarization variation techniques, and/or multiple exposure techniques are used). Generally, such a pattern will correspond to a particular functional layer in a device being created in the target portion, such as an integrated circuit or other device (see below). A patterning structure may be reflective and/or transmissive. Examples of patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An array of grating light valves (GLVs) may also be used in a corresponding manner, where each GLV may include a plurality of reflective ribbons that can be deformed relative to one another (e.g. by application of an electric potential) to form a grating that reflects incident light as diffracted light. A further alternative embodiment of a programmable mirror array employs a matrix arrangement of very small (possibly microscopic) mirrors, each of which can be individually tilted about an axis by applying a suitable localized electric field, or by employing piezoelectric actuation means. For example, the mirrors may be matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193 and PCT patent applications WO 98/38597 and WO 98/33096, which documents are incorporated herein by reference. In the case of a programmable mirror array, the support structure may be embodied as a frame or table, for example, which may be fixed or movable as required.

A programmable LCD panel. An example of such a construction is given in U.S. Pat. No. 5,229,872, which is incorporated herein by reference. As above, the support structure in this case may be embodied as a frame or table, for example, which may be fixed or movable as required.

A support structure may be provided to support (i.e. to bear the weight of) the patterning structure. The support structure may hold the patterning structure in a manner that may depend on the orientation of the patterning structure, the design of the lithographic apparatus, and/or other conditions (such as, for example, whether or not the patterning structure is held in a vacuum environment). The support can be performed using mechanical clamping, vacuum, or other clamping techniques (for example, electrostatic clamping under vacuum conditions). The support structure may be a frame or a table, for example, which may be fixed or movable as required and which may ensure that the patterning structure is at a desired position (for example, with respect to the projection system).

For purposes of simplicity, the rest of this text may, at certain locations, specifically direct itself to examples involving a mask (or "reticle") and mask table (or "reticle table"); however, the general principles discussed in such instances should be seen in the broader context of the patterning structure as hereabove set forth.

A lithographic apparatus may be used to apply a desired pattern onto a surface (e.g. a target portion of a substrate). Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies and/or portion(s) thereof) on a substrate (e.g. a wafer of silicon or other semiconductor material) that has been coated with a layer of radiation-sensitive material (e.g. resist). In general, a single wafer will contain a whole matrix or network of adjacent target portions that are successively irradiated via the projection system (e.g. one at a time).

Among current apparatus that employ patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. A projection beam in a scanning type of apparatus may have the form of a slit with a slit width in the scanning direction. More information with regard to lithographic devices as here described can be gleaned, for example, from U.S. Pat. No.6,046,792, which is incorporated herein by reference.

In a manufacturing process using a lithographic projection apparatus, a pattern (e.g. in a mask) is imaged onto a substrate that is at least partially covered by a layer of radiation-sensitive material (e.g. resist). Prior to this imaging procedure, the substrate may undergo various other procedures such as priming, resist coating, and/or a soft bake. After exposure, the substrate may be subjected to other procedures such as a post-exposure bake (PEB), development, a hard bake, and/or measurement/inspection of the imaged features. This set of procedures may be used as a basis to pattern an individual layer of a device (e.g. an IC). For example, these transfer procedures may result in a patterned layer of resist on the substrate. One or more pattern processes may follow, such as deposition, etching, ion-implantation (doping), metallization, oxidation, chemomechanical polishing, etc., all of which may be intended to create, modify, or finish an individual layer. If several layers are required, then the whole procedure, or a variant thereof, may be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

A substrate as referred to herein may be processed before or after exposure: for example, in a track (a tool that typically applies a layer of resist to a substrate and develops the exposed resist) or a metrology or inspection tool. Where applicable, the disclosure herein may be applied to such and other substrate processing tools. Further, the substrate may be processed more than once (for example, in order to create a multi-layer IC), so that the term "substrate" as used herein may also refer to a substrate that already contains multiple processed layers.

The term "projection system" should be broadly interpreted as encompassing various types of projection system, including refractive optics, reflective optics, catadioptric systems, and charged particle optics, for example. A particular projection system may be selected based on factors such as a type of exposure radiation used, any immersion fluid(s) or gas-filled areas in the exposure path, whether a vacuum is used in all or part of the exposure path, etc. For the sake of simplicity, the projection system may hereinafter be referred to as the "lens." The radiation system may also include components operating according to any of these design types for directing, shaping, reducing, enlarging, patterning, and/or otherwise controlling the projection beam of radiation, and such components may also be referred to below, collectively or singularly, as a "lens."

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT Application No. WO 98/40791, which documents are incorporated herein by reference.

The lithographic apparatus may also be of a type wherein the substrate is immersed in a liquid having a relatively high refractive index (e.g. water) so as to fill a space between the final element of the projection system and the substrate. Immersion liquids may also be applied to other spaces in the lithographic apparatus, for example, between the mask and the first element of the projection system. The use of immersion techniques to increase the effective numerical aperture of projection systems is well known in the art.

In the present document, the terms "radiation" and "beam" are used to encompass all types of electromagnetic radiation or particle flux, including ultraviolet radiation (e.g. with a wavelength of 365, 248, 193, 157 or 126 nm), EUV (extreme ultra-violet radiation, e.g. having a wavelength in the range 5–20 nm), and X-rays, as well as particle beams (such as ion or electron beams).

Although specific reference may be made in this text to the use of lithographic apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, DNA analysis devices, etc. The skilled artisan will appreciate that, in the context of such alternative applications, any use of the terms "reticle," "wafer," or "die" in this text should be considered as being replaced by the more general terms "mask," "substrate," and "target portion" (or "exposure area"), respectively.

A projection lens has a large numerical aperture. Consequently the lens may have a narrow focus plane. When imaging a pattern onto a substrate, it may be desirable or necessary to ensure that an uppermost surface of the substrate (i.e. the surface onto which the pattern is to be imaged) lies within the focus plane of the projection lens.

A level sensor may be used to determine the position of the uppermost surface of the substrate. If the level sensor indicates that the uppermost surface of the substrate does not lie in the focus plane of the projection lens, the height of the substrate table bearing the substrate may be adjusted accordingly. The level sensor may also be used to measure any slope that may be present in the surface of the substrate, and the substrate table may be tilted accordingly.

Level sensors used for lithographic projection apparatus may be subject to process dependency. Process dependency is a form of error in which level sensor measurements provide differing results depending on how a substrate being measured has previously been processed.

SUMMARY

A level sensor according to one embodiment of the invention includes a first reflector configured to direct a beam from a light source toward the wafer surface and a second reflector configured to direct the beam from the wafer surface to a detector. A magnitude of an apparent depression of the wafer surface due to translation of the beam at reflective surfaces of the first and second reflectors is less than thirty-five nanometers. Embodiments of the invention also include a lithographic apparatus having such a level sensor, where the sensor is configured to measure a height of a wafer surface.

A plurality of lithographic projection apparatus according to another embodiment of the invention includes a radiation system configured to provide a projection beam of radiation; a support structure configured to support a patterning structure, the patterning structure serving to pattern the projection beam according to a desired pattern; a substrate table configured to hold a substrate; and a projection system configured to project the patterned beam onto a target portion of the substrate. Each lithographic apparatus includes a level sensor having a first reflector positioned to direct light from a light source towards a wafer surface a second reflector positioned to direct light reflected from the wafer surface to a detector. The first reflectors of the level sensors of the plurality of lithographic apparatus are substantially identical to one another, and the second reflectors of the level sensors of the plurality of lithographic apparatus are substantially identical to one another.

A level sensor according to a further embodiment of the invention includes a first reflector configured to direct a beam from a light source toward a wafer surface and a second reflector configured to direct the beam from the wafer surface to a detector. A reflective surface of the first reflector has a coating with an optical thickness of 430 nanometers +/−60 nanometers at a central wavelength of the beam, and a reflective surface of the second reflector has a coating with an optical thickness of 430 nanometers +/−60 nanometers at a central wavelength of the beam. Embodiments of the invention also include a lithographic apparatus having such a level sensor, where the sensor is configured to measure a height of a wafer surface.

A level sensor according to a further embodiment of the invention includes a first reflector configured to direct a beam from a light source toward a wafer surface and a second reflector configured to direct the beam from the wafer surface to a detector. A reflective surface of the first reflector has a coating, and a reflective surface of the second reflector has a coating. The optical thickness of the coating of the reflective surface of the first reflector at a central wavelength of the beam differs from the optical thickness of the coating of the reflective surface of the second reflector at a central wavelength of the beam by 205 nanometers +/−60 nanometers. Embodiments of the invention also include a lithographic apparatus having such a level sensor, where the sensor is configured to measure a height of a wafer surface.

A level sensor according to a further embodiment of the invention includes a first reflector configured to direct a beam from a light source toward the wafer surface and a second reflector configured to direct the beam from the wafer surface to a detector. A reflective surface of at least one of the first and second reflectors comprises aluminum having a coating of native oxide. Embodiments of the invention also include a lithographic apparatus having such a level sensor, where the sensor is configured to measure a height of a wafer surface.

A level sensor according to a further embodiment of the invention includes a first reflector configured to direct a beam from a light source toward a wafer surface and a second reflector configured to direct the beam from the wafer surface to a detector. The first reflector includes a first surface configured to direct the beam toward the wafer surface and a second surface configured to direct the beam toward the first surface. The second reflector includes a first surface configured to direct the beam to the detector and a second surface configured to direct the beam toward the first surface. Embodiments of the invention also include a lithographic apparatus having such a level sensor, where the sensor is configured to measure a height of a wafer surface.

A method according to a further embodiment of the invention includes positioning a first reflector of a level sensor of a lithographic apparatus to direct a light beam from a light source toward a surface of a wafer; positioning a second reflector of a level sensor of a lithographic apparatus to direct the beam from the surface of the wafer to a detector; and selecting the first and second reflectors to obtain a minimum total effective translation of the beam at the surfaces of the first and second reflectors.

A lithographic method according to a further embodiment of the invention includes using a first reflector of a level sensor of a lithographic apparatus to direct a light beam from a light source toward a wafer surface; using a second reflector of a level sensor of a lithographic apparatus to direct the beam from the wafer surface to a detector; and determining a height of the surface of the wafer based on the beam incident on the detector. A magnitude of an apparent depression of the surface of the wafer due to translation of the beam at reflective surfaces of the first and second reflectors is less than thirty-five nanometers.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the invention include, for example, methods and apparatus that may be used to substantially overcome or mitigate one or more problems relating to level sensor process dependency.

Figure 1:
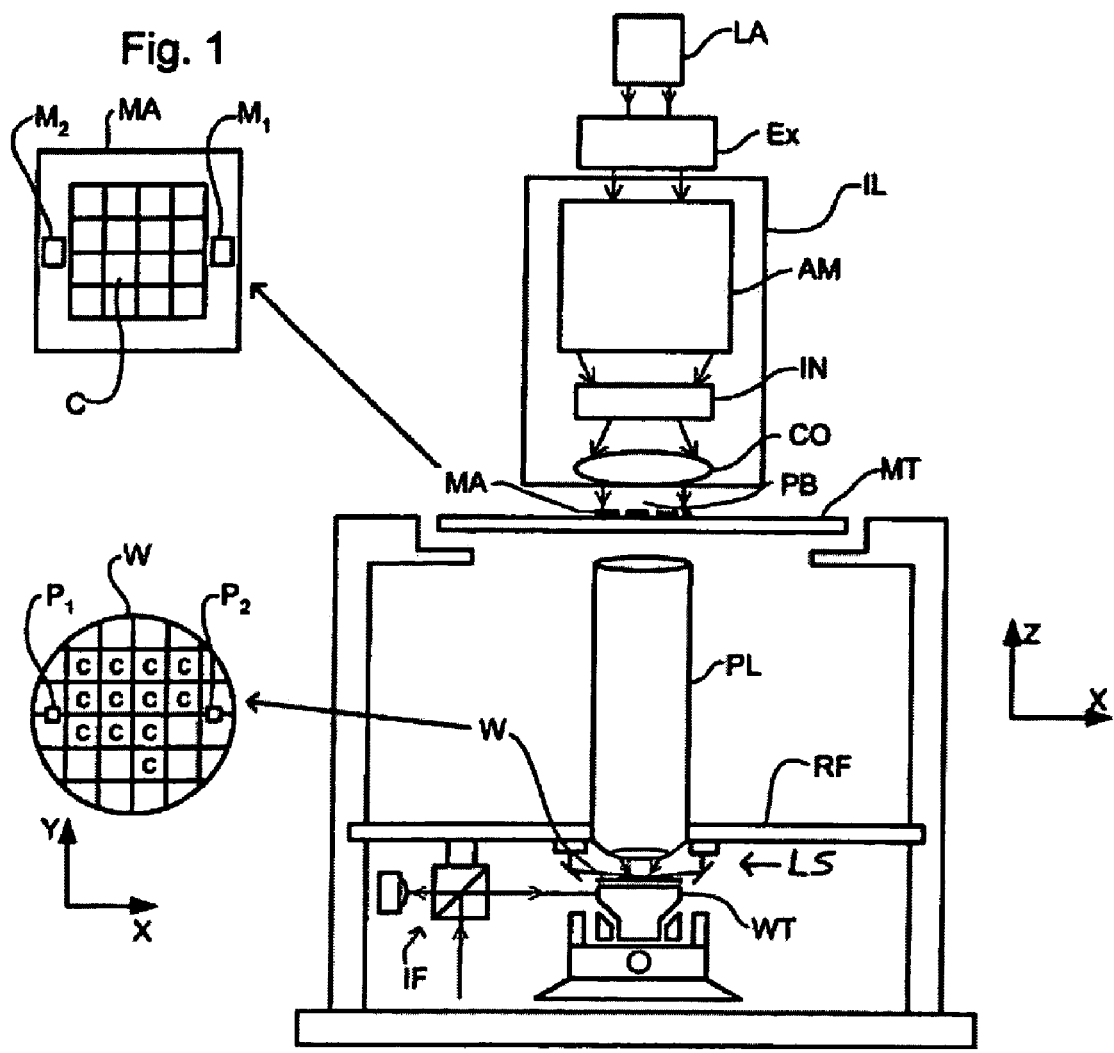
FIG. 1 depicts a lithographic projection apparatus including a level sensor.

FIG. 1 schematically depicts a lithographic projection apparatus according to a particular embodiment of the invention. The apparatus comprises:

A radiation system configured to supply (e.g. having structure capable of supplying) a projection beam of radiation. In this particular example, the radiation system Ex, IL, for supplying a projection beam PB of radiation (e.g. UV or EUV radiation) also comprises a radiation source LA;

A support structure configured to support a patterning structure capable of patterning the projection beam. In this example, a first object table (mask table) MT is provided with a mask holder for holding a mask MA (e.g. a reticle), and is connected to a first positioning structure configured to accurately position the mask with respect to item PL;

A second object table (substrate table) configured to hold a substrate. In this example, substrate table WT is provided with a substrate holder for holding a substrate W (e.g. a resist-coated semiconductor wafer), and is connected to a second positioning structure configured to accurately position the substrate with respect to item PL and (e.g. interferometric) measurement structure IF, which is configured to accurately indicate the position of the substrate and/or substrate table with respect to lens PL; and A projection system ("lens") configured to project the patterned beam. In this example, projection system PL (e.g. a refractive lens group possibly including lens elements of quartz and/or calcium fluoride, a catadioptric system possibly including lens elements made of such materials, and/or a catoptric or a mirror system) is configured to image an irradiated portion of the mask MA onto a target portion C (e.g. comprising one or more dies and/or portion(s) thereof) of the substrate W. Alternatively, the projection system may project images of secondary sources for which the elements of a programmable patterning structure may act as shutters. The projection system may also include a microlens array (MLA), e.g. to form the secondary sources and to project microspots onto the substrate.

As here depicted, the apparatus is of a transmissive type (e.g. has a transmissive mask). However, in general, it may also be of a reflective type, for example (e.g. with a reflective mask). Alternatively, the apparatus may employ another kind of patterning structure, such as a programmable mirror array of a type as referred to above.

The source LA (e.g. a mercury lamp, an excimer laser, an electron gun, a laser-produced plasma source or discharge plasma source, or an undulator provided around the path of an electron beam in a storage ring or synchrotron) produces a beam of radiation. This beam is fed into an illumination system (illuminator) IL, either directly or after having traversed a conditioning structure or field, such as a beam expander Ex, for example. The illuminator IL may comprise an adjusting structure or field AM for setting the outer and/or inner radial extent (commonly referred to as σ-outer and σ-inner, respectively) of the intensity distribution in the beam, which may affect the angular distribution of the radiation energy delivered by the projection beam at, for example, the substrate. In addition, the apparatus will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable direction mirrors); this latter scenario is often the case when the source LA is an excimer laser. The current invention and claims encompass both of these scenarios.

The beam PB subsequently intercepts the mask MA, which is held on a mask table MT. Having traversed (alternatively, having been selectively reflected by) the mask MA, the beam PB passes through the lens PL, which focuses the beam PB onto a target portion C of the substrate W. With the aid of the second positioning structure (and interferometric measuring structure IF), the substrate table WT can be moved accurately, e.g. so as to position different target portions C in the path of the beam PB. Similarly, the first positioning structure can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator (e.g. to make fine adjustments in mask orientation and position) or may be fixed. Mask MA and substrate W may be aligned using mask alignment marks M1, M2 and substrate alignment marks P1, P2.

The depicted apparatus can be used in several different modes:

1. In step mode, the mask table MT is kept essentially stationary, and an entire mask image is projected at once (i.e. in a single "flash") onto a target portion C. The substrate table WT is then shifted in the x and/or y directions so that a different target portion C can be irradiated by the beam PB. In step mode, a maximum size of the exposure field may limit the size of the target portion imaged in a single static exposure;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). The velocity and/or direction of the substrate table WT relative to the mask table MT may be determined by magnification, demagnification (reduction), and/or image reversal characteristics of the projection system PL. In this manner, a relatively large target portion C can be exposed, without having to compromise on resolution. In scan mode, a maximum size of the exposure field may limit the width (in the non-scanning direction) of the target portion exposed in a single dynamic exposure, whereas the length of the scanning motion may determine the height (in the scanning direction) of the target portion exposed;

3. In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes programmable patterning structure, such as a programmable mirror array of a type as referred to above.

Combinations of and/or variations on the above-described modes of use or entirely different modes of use may also be employed.

The level sensor is an important part of a lithographic projection apparatus. As the wavelengths used by lithographic apparatus become shorter, the focus depth of the projection lens reduces, and the accuracy of the level sensor becomes increasingly important.

Level sensors used for lithographic projection apparatus may be subject to process dependency. Process dependency is a form of error in which level sensor measurements provide differing results depending on how a substrate being measured has previously been processed. For example, a level sensor may provide a particular height measurement for a wafer comprising a silicon substrate coated with a single layer of resist, and may provide a different height measurement for a wafer comprising a silicon substrate coated with several layers of resist, even if both wafers are at the same actual height. The error is referred to as process dependent apparent surface depression, and is understood to be caused by an optical effect known as the Goos-Haenchen shift [ref: F. Goos and H. Haenchen, Ann. Phys. 1 (6), 333 (1947)]. The Goos-Haenchen shift is a lateral translation of light along a reflecting surface (in this case the resist) during reflection. The shift is dependent upon the material and layer structure of the substrate, and in addition is wavelength and polarisation dependent. As a result of apparent surface depression, a substrate may not be correctly located in the focus plane of the projection lens. When this occurs, the resolution of a pattern imaged onto the substrate may be compromised.

Process dependent apparent surface depression is by its nature very difficult to monitor. Although some calibration for process dependency may be performed, residual process dependent apparent surface depression may remain. Different processes may give rise to widely varying apparent surface depression, so that it may be desirable or necessary to obtain a different calibration for each process. In addition, different lithographic apparatus may experience widely varying apparent surface depression in response to the same processes (i.e. a given process may give rise to a particular apparent surface depression in one lithographic apparatus, and may give rise to an entirely different apparent surface depression in a different lithographic apparatus). Such a dependence may have the effect that a calibration performed for one lithographic apparatus cannot be used for another lithographic apparatus.

Embodiments of the present invention relate to a level sensor for a lithographic apparatus. Lithographic projection apparatus are well known in the prior art, and generally comprise a radiation system for supplying a projection beam of radiation; a support structure for supporting a patterning structure, the patterning structure serving to pattern the projection beam according to a desired pattern; a substrate table for holding a substrate; and a projection system for projecting the patterned beam onto a target portion of the substrate.

A level sensor, generally indicated as LS in FIG. 1, may be used to measure the height and slope of the uppermost surface of the substrate W. The wafer table WT may be raised or lowered (and/or tilted) accordingly, e.g. to ensure that the uppermost surface of the substrate W is located in the focus plane of the projection lens PL.

Figure 2:
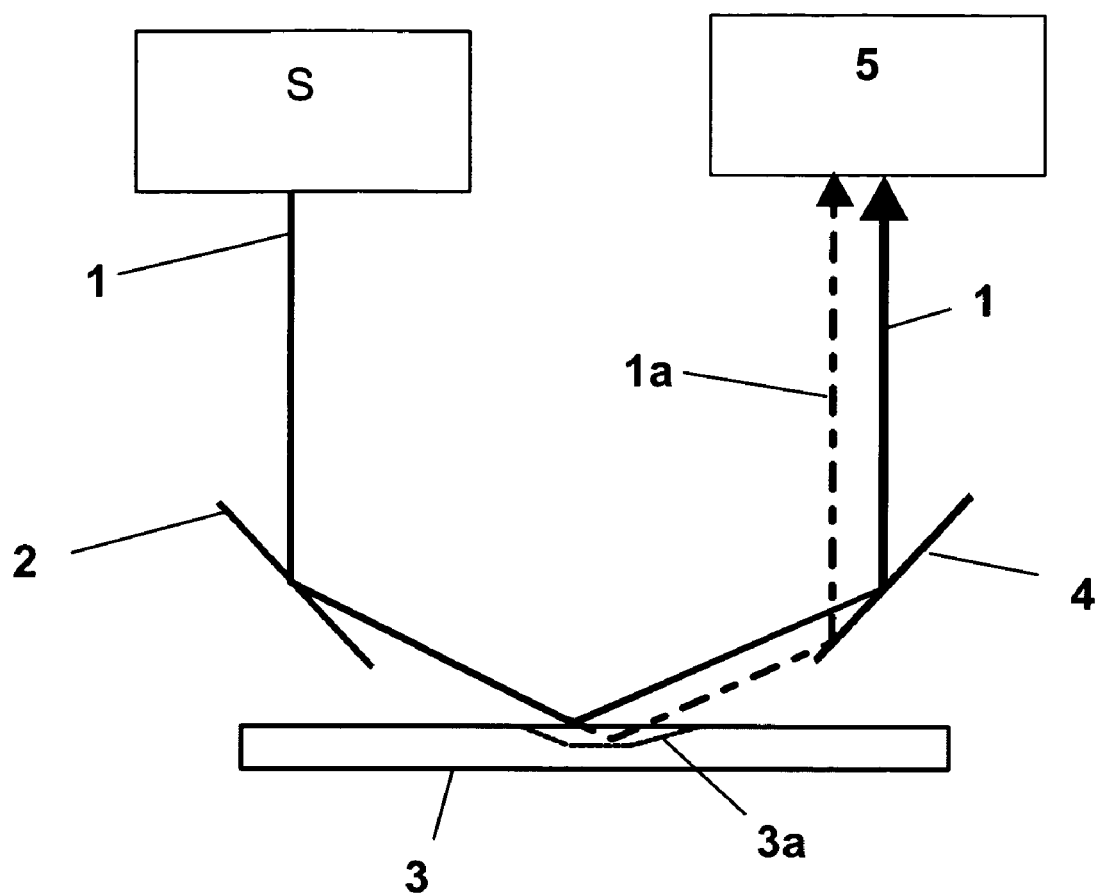
FIG. 2 depicts a level sensor to which an embodiment of the invention may be applied.

FIG. 2 illustrates a level sensor to which an embodiment of the invention may be applied. A beam of light 1 generated by a suitable source S is directed via a folding mirror 2 to a substrate 3. The beam of light 1 is reflected from the surface of the substrate and is directed via a second folding mirror 4 to a detector 5.

A change of height of the surface of the substrate 3 is seen as a displacement of the location at which the beam of light 1 is incident upon the detector 5. For example, if the surface of the substrate is flat, then the beam of light 1 is incident upon the centre of the detector 5. If the surface of the substrate includes an indentation, shown by dotted line 3a, then the point at which the beam of light is reflected is displaced, as shown by broken line 1a. An associated translation of the beam of light 1a occurs at the detector 5, indicating that the height of the surface of the substrate has changed. The height of the surface of the substrate 3 is thus closely monitored by the level sensor.

Apparent surface depression may arise because the beam of light 1 in general is not entirely directly reflected from the upper surface of the substrate 3. Instead, a portion of the beam of light 1 may be translated along the surface of the substrate 3 for a short distance before being reflected (such translation is known as the Goos-Haenchen shift). Typically, the distance of translation is of the order of one wavelength of the beam of light.

If the distance of the translation were to be consistent, then it would be possible to calibrate the level sensor to account for the apparent surface depression. However, it has been found that the apparent surface depression has a strong dependency upon the structure of the surface of the substrate. For example, a silicon wafer coated with photo-resist of a certain thickness and index of refraction will give rise to an apparent surface depression, whereas a substrate comprising a silicon wafer coated with a photo-resist of another thickness and/or index of refraction may give rise to an entirely different apparent surface depression. A substrate comprising a wafer coated with several layers of resist can give rise to an entirely different apparent surface depression.

The process dependency of the apparent surface depression may be reduced by ensuring that the beam of light 1 has a broad wavelength band and has a variety of polarisations. At least some embodiments of the invention may be applied to provide a further reduction of the process dependency of the apparent surface depression. For example, such reduction may be achieved via the selection of the folding mirrors 2, 4 as described below.

The inventors have realised that the folding mirrors 2, 4 of the level sensor are a primary source of process dependency. This would at first sight appear not to be possible, since the folding mirrors 2, 4 do not change in any way when a process is applied to a substrate, but instead always remain the same. Indeed, it would seem to be the case that process dependency must arise entirely from the substrate, since the substrate is the only article to which the process has been applied. However, the inventors have realised that the mirrors give rise to an apparent surface depression which is wavelength and polarisation dependent. The process applied to the substrate acts as a filter. The wavelength and polarisation dependent error caused by the reflectors/mirrors is added to the apparent surface depression generated by the substrate surface to give a combined apparent surface depression which may vary from lithography apparatus to lithography apparatus and/or from process to process. Furthermore, the inventors have realised that appropriate selection of the mirrors may be applied to reduce this variation.

Figure 3A:
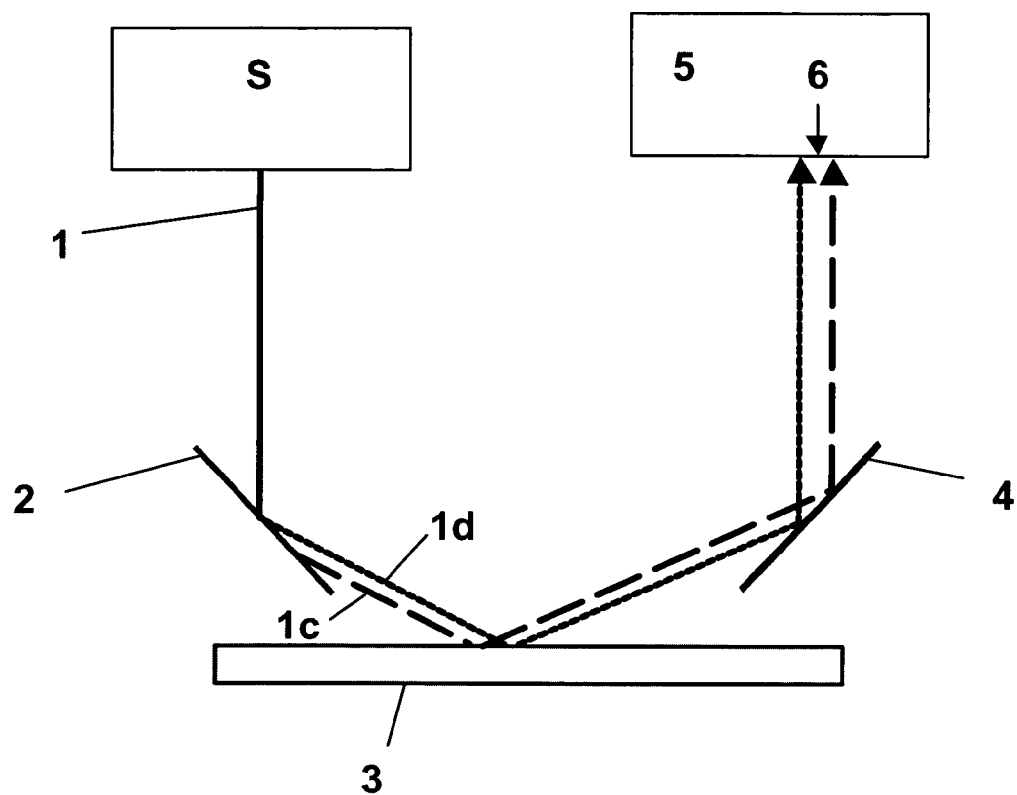
FIG. 3 depicts a level sensor and an associated problem identified by the inventors and addressed by embodiments of the invention.

A simplified example of the combined effect of the mirrors and the substrate surface is shown in FIG. 3. Referring to FIG. 3a, a light source for a level sensor provides a beam 1 which includes p-polarised light and s-polarised light. Folding mirror 2 has a polarisation dependent Goos-Haenchen shift which causes p-polarised light to be translated (the s-polarised light is not translated). Upon reflection from the folding mirror 2 the beam is separated into two: a translated p-polarised beam as represented by broken line 1c, and an untranslated s-polarised beam as represented by the dotted line 1d. The surface of the substrate 3 reflects the p-polarised beam with an additional slight translation (the s-polarised beam is not translated). The detector 5 detects the p-polarised and s-polarised beams as a single beam with a centre point 6 (assuming that p-polarised and s-polarised beams are of equal intensity). The detected height includes an apparent surface depression which is caused in part by the mirror 2 and in part by the substrate 3.

Figure 3B:
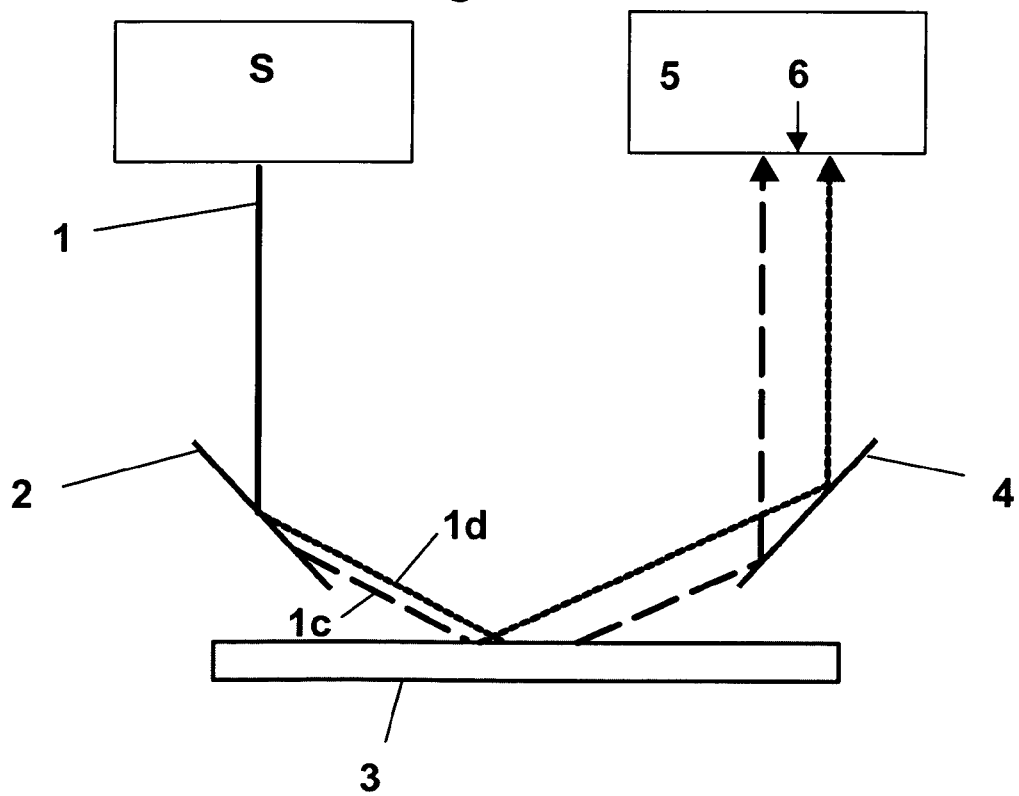

FIG. 3b shows the effect of using the same level sensor to detect a substrate 3 having a different surface. The mirror 2 has the same wavelength dependent Goos-Haenchen shift, but this substrate provides a much larger shift, with the result that the centre point 6 of the detected beam is shifted to the left. Alternatively, when two different level sensors are used to measure the substrate of FIGS. 3a and 3b, each level sensor may suffer a different apparent surface depression error due e.g. to differences between the mirrors of the level sensors.

The above example is overly simplified for the purposes of illustration. Several different aspects may increase the complexity of the apparent surface depression. When the substrate 3 comprises a 'wafer stack' (i.e. a wafer coated with several process layers), for example, it may act as a polarisation filter, preferentially reflecting s-polarised light. This effect may cause the intensities of the p-polarised beam 1c and the s-polarised beam 1d to be unequal at the detector 5, causing a shift of the detected centre point 6. In addition, the mirror 4 may give rise to a polarisation dependent Goos-Haenchen shift.

As indicated above, it may be desirable for the beam 1 to be not a single wavelength but rather to comprise a broad band of wavelengths. The broad band is used because it has been found to reduce apparent surface depression (e.g. via averaging of the wavelength dependent Goos-Haenchen shift). A wavelength dependent Goos-Haenchen shift arises at each of the folding mirrors 2,4 and at the surface of the substrate 3. In addition, the folding mirrors 2,4 and especially the substrate 3 may act as wavelength filters.

The polarisation dependent and wavelength dependent Goos-Haenchen shifts, together with the polarisation dependent and wavelength dependent filtering, provided by the folding mirrors 2, 4 and the substrate 3 may give rise to an apparent surface depression which has an extremely complicated process dependency.

The apparent surface depression has been found to vary from process to process (i.e. from processed substrate to processed substrate) and from level sensor to level sensor. It had not previously been realised until now that the mirrors provide a significant contribution to the process dependent apparent surface depression.

In addition to realising that the mirrors provide an important contribution to the apparent surface depression, the inventors have realised that this contribution may be mitigated by controlling those parameters of the mirrors which give rise to the Goos-Haenchen shift via the selection of appropriate mirrors.

Benefits of the selection of appropriate mirrors may be threefold. The mirrors may be selected to provide a level sensor which has a reduced apparent surface depression (for a variety of processed substrates), thereby providing improved level sensing for a given level sensor. Also the mirrors may be selected to provide a level sensor which has apparent surface depression which is robust to small process variations (for example, resist and oxide thickness variations). Particularly when levelling needs to be corrected for apparent surface depression by correction values, it may be possible to determine these correction values with fewer measurements, as these may be applicable on other fields and wafers with the same product.

In addition, where several lithography apparatus are used, machine to machine variation of the process dependent apparent surface depression can be substantially eliminated by ensuring that the mirrors of the level sensors in the lithography apparatus all have the same properties (i.e. all give rise to the same Goos-Haenchen shift).

Thus, in an embodiment of one aspect of the invention, level sensors are provided for a multiplicity of lithography apparatus, the mirrors of the level sensors having substantially identical optical properties. The mirrors may be metallic, for example silver (Ag), and may be provided with a coating, for example aluminum oxide ($Al_2O_3$) (other coating materials may be used). The coating has been found by the inventors to give rise to a Goos-Haenchen shift, the wavelength and polarisation dependency of the shift being dependent upon the thickness of the coating. Therefore in this embodiment of the invention, the thickness of the coating of the mirrors used for the level sensor is controlled to provide a minimised Goos-Haenchen shift (appropriate thicknesses of $Al_2O_3$ are described further below). A 'family' of level sensors (and the lithographic apparatus to which they are fitted) may be defined for which the mirrors of the level sensors are substantially identical. For example, it may be specified that the mirrors are all fabricated together in a single batch.

An alternative example of metallic mirrors is mirrors having an aluminum coating that is covered with a native oxide. This native oxide grows naturally after deposition of the aluminum coating, when the aluminum coating is exposed to air. The thickness of the aluminum oxide will remain small, typically less than 10 nm. It has been found that a thickness of this order provides a Goos-Haenchen shift. However, the thickness of the coating is very consistent from mirror to mirror, thereby providing mirrors with substantially identical properties. It may not be desirable to provide a native oxide coating on Ag mirrors, since such a procedure may lead to blackening of the surface of the mirrors.

An alternative way in which level sensor mirrors having substantially identical optical properties may be obtained is by using gold (Au) mirrors. Use of uncoated Au mirror surfaces, for example, may allow the Goos-Haenchen shift caused by the mirrors to be substantially identical from mirror to mirror.

Eliminating machine-to-machine variation of process dependent apparent surface depression may be particularly advantageous. Currently, a calibration of apparent surface depression may be performed for a lithography apparatus for a substrate to which a particular process (process A) has been applied. The calibration is used for that lithography apparatus each time a substrate is used to which process A has been applied. The calibration is time consuming and costly. When using prior art level sensors, a level sensor of a second lithography apparatus would need to be calibrated separately for process A, and similarly for third, fourth lithography apparatus, etc.

In some applications of an embodiment of the first aspect of the invention (i.e. where the mirrors of the level sensors have substantially identical properties), only one level sensor is calibrated for process A, and the resulting calibration is used for all of the level sensors (i.e. for all of the lithographic apparatus to which the level sensors are fitted). This procedure may provide a significant time and cost saving. Similarly, for a substrate to which a different process (process B) has been applied, one level sensor is calibrated, and the resulting calibration is used for all of the level sensors (i.e. for all of the lithographic apparatus to which the level sensors are fitted).

In addition (or alternatively) to ensuring that the mirrors of different level sensors have substantially identical properties, it may be advantageous to provide mirrors which give rise to minimal apparent surface depression. It may appear that this is not necessary, given that a calibration may be performed for each process, which may be used for many level sensors. However, the calibration does not eliminate apparent surface depression. For example, consider a substrate having semiconductor regions and copper regions. The different regions may give rise to a different apparent surface depression, so that although an average apparent surface depression may be calibrated, specific regions of the substrate may still cause the level sensor to suffer different apparent surface depressions.

Figure 9A:
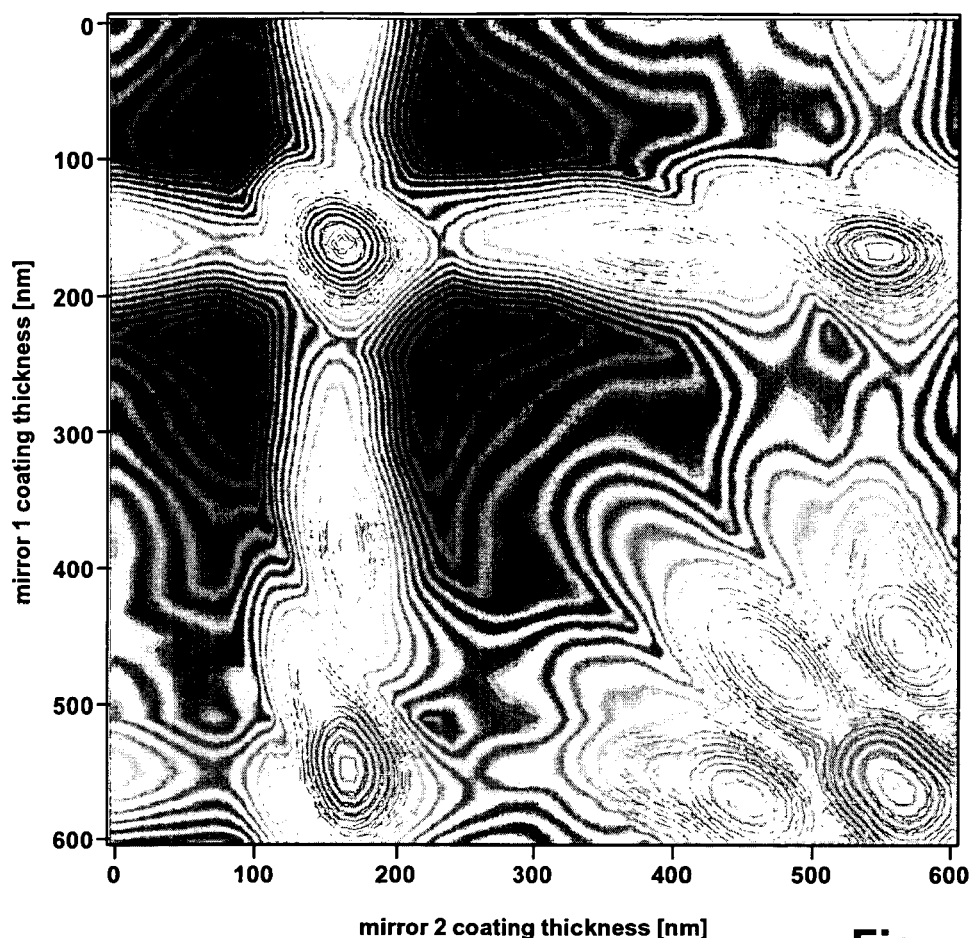
Figure 9B:
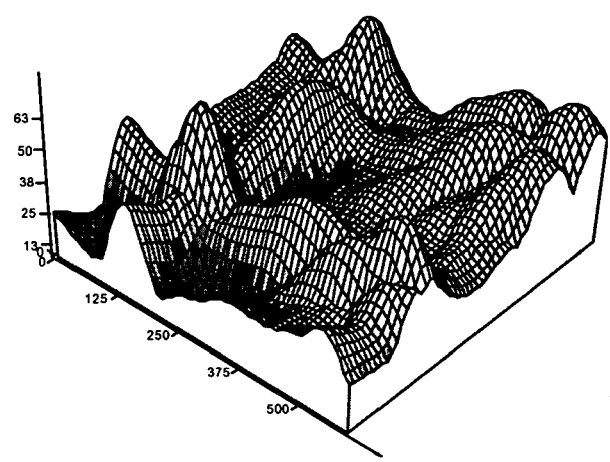
Figure 10:
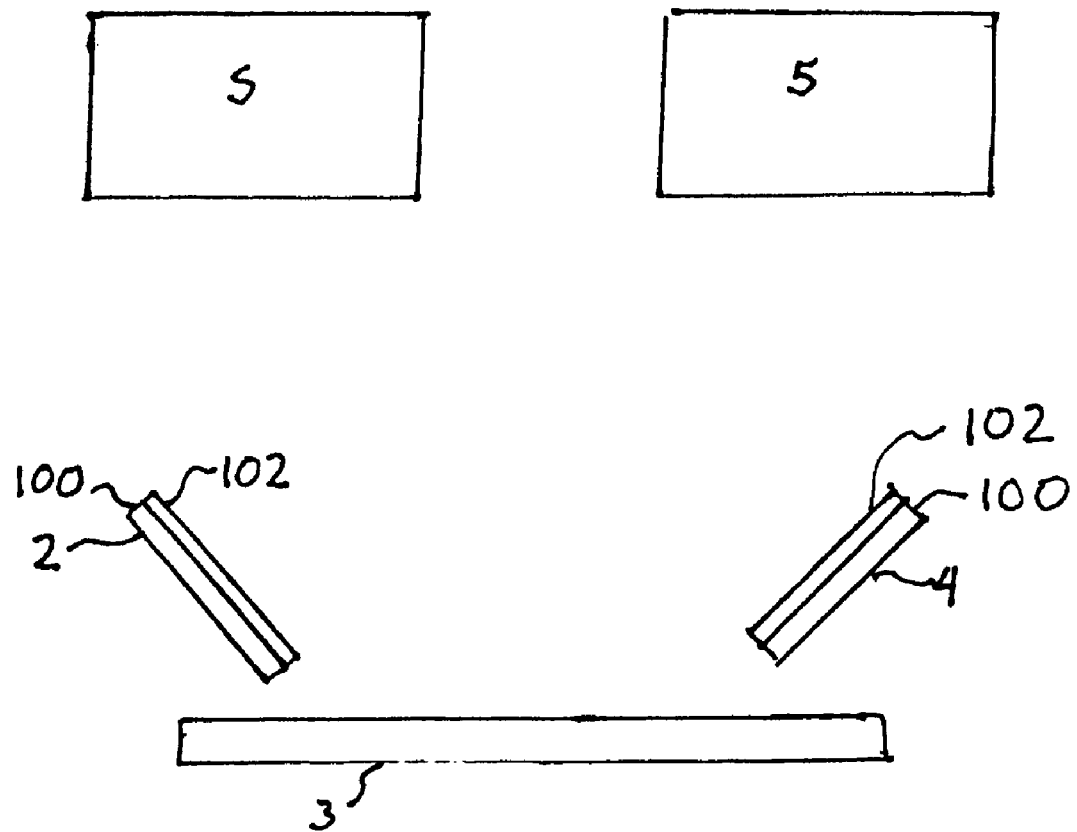
FIG. 10 depicts the level sensor of FIG. 2 in more detail than FIG. 2.

An embodiment of a second aspect of the invention comprises a level sensor provided with mirrors having optical properties which are selected to minimize process dependent apparent surface depression. For example, an embodiment of this aspect of the invention may include a level sensor having metallic mirrors. Referring to FIG. 2, the level sensor comprises a source S, a detector 5, and folding mirrors 2, 4. The folding mirrors 2,4 comprise an Ag substrate with a $Al_2O_3$ coating, which are shown in more detail in FIG. 10 (other suitable coatings may be used). As shown in FIG. 10, folding mirrors 2, 4 include Ag substrate 100 and $Al_2O_3$ coating 102. Coatings have been found by the inventors to give rise to a Goos-Haenchen shift, the wavelength and polarisation dependency of the shift being dependent upon the thickness of the coating. Therefore in this embodiment of the invention the thickness of the $A_2O_3$ coating of the mirrors used for the level sensor may be selected to provide a minimized Goos-Haenchen shift. The appropriate thickness may be dependent to some extent upon the processes that have been applied to the substrate 3. However, it has been found that in general a coating of 275 nm of $Al_2O_3$ provides favorable results. Other coating thicknesses which provide favorable results are described below in relation to FIG. 7 to 9.

In addition to being applicable to level sensors of the form shown in FIG. 2, embodiments of the first and second aspects of the invention may be applied to other forms of level sensor. For example, FIG. 4 shows an alternative level sensor to which an embodiment of the invention may be applied.

Figure 4:
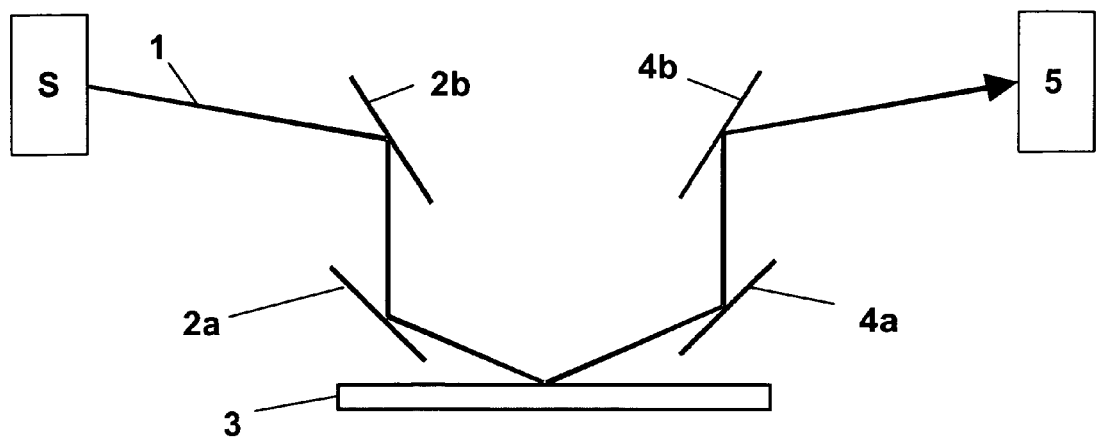
FIG. 4 depicts an alternative level sensor to which an embodiment of the invention may be applied.

Referring to FIG. 4, a level sensor comprises a source S, detector 5 and four folding mirrors 2a, 2b, 4a, 4b. It can be seen that the level sensor shown in FIG. 4 corresponds to that shown in FIG. 2, except that each folding mirror 2, 4 is replaced with a pair of folding mirrors 2a, 2b, and 4a, 4b.

It will be appreciated that the invention is not restricted to level sensors which use metallic folding mirrors, but may be applied when any form of beam-steering optics is used. The beam-steering optics may for example comprise a prism arranged to allow a beam to enter the prism, and then undergo internal reflection from a face of the prism before leaving the prism at a different angle. The prism may be provided with a coating on the external side of the face which provides the reflection, the coating being controlled according to an embodiment of the invention to provide a minimal Goos-Haenchen shift. Additionally or alternatively, the angle of incidence of the beam into the prism may be adjusted to reduce a Goos-Haenchen shift arising at the prism.

In an alternative embodiment of the invention, one or more metallic mirrors are replaced with fully dielectric mirrors, i.e. mirrors comprising a non-conducting medium. Apparent surface depression only occurs for reflecting surfaces that cause a phase jump of reflected light which is dependent on the angle of incidence. In mathematical terms, apparent surface depression only occurs when the following condition is satisfied:

$$\frac{\partial \phi}{\partial \theta_i} \neq 0,$$

where $\phi$ is the phase jump (the argument of the complex reflection coefficient) and $\theta_i$ is the angle of incidence of the light beam. For a boundary between air and a dielectric medium (with a purely real refractive index) the derivative is zero. Therefore, a dielectric mirror may have a zero Goos-Haenchen effect and no contribution to apparent surface depression.

A potential disadvantage of using dielectric mirrors is that they may preferentially reflect s-polarised light, with the possible result that apparent surface depression caused by the surface of the wafer is accentuated (the averaging effect provided by using all polarisations being lost). A potential advantage of using dielectric mirrors is that, since the apparent surface depression may be caused entirely by the surface of the wafer, machine-to-machine variations of the apparent surface depression may be substantially eliminated.

The dielectric mirror used in one embodiment of the invention comprises a silicon slab which has an anti-reflective coating on its reverse side. The reflection loss caused by the silicon is at an acceptably low level. Dielectric mirrors may be implemented using any suitable material. The embodiment may for example be of the type shown in FIG. 2 or the type shown in FIG. 4.

In further alternative embodiments of the invention, one or more folding mirrors of the level sensor are replaced with a pair of metallic mirrors. The mirrors are arranged so that the second mirror provides a Goos-Haenchen shift which is opposite to that provided by the first mirror, such that each pair of metallic mirrors may provide a zero net Goos-Haenchen shift. An example of a suitable pair of mirrors is shown in FIG. 5b. Referring to FIG. 5b, a pair of identical metallic mirrors 21, 22 are symmetrically arranged so that a beam of light 23 is incident upon both mirrors with the same angle of incidence. Since the metallic mirrors 21, 22 are identical, including having the same thickness of coating layer, the Goos-Haenchen shift caused by each mirror cancels out to give a net apparent surface depression of zero. This cancellation may be effective for every wavelength and every polarisation state, due e.g. to the symmetry of the mirror arrangement.

Figure 5A:
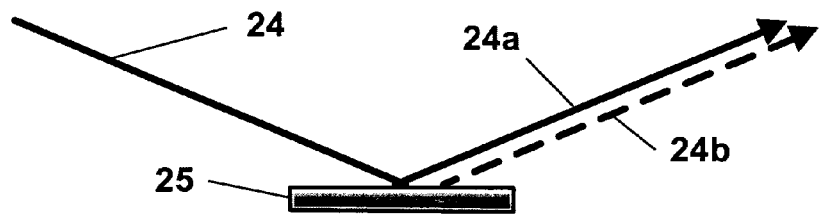
FIG. 5 depicts part of a level sensor according to an embodiment of the invention.
Figure 5B:
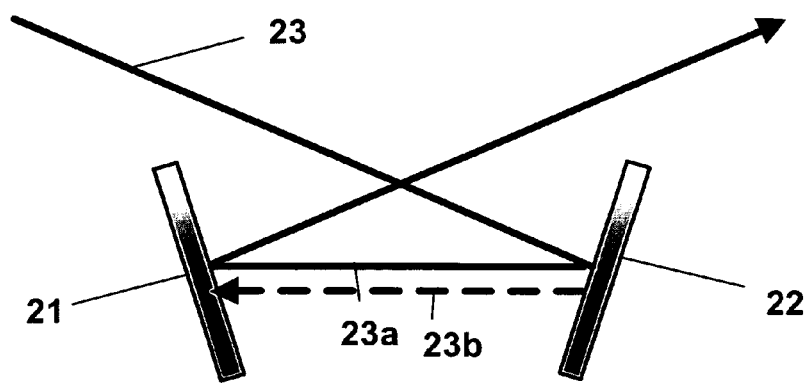

The effect of the mirrors 21, 22 can be understood by comparing them with a single mirror, as shown in FIG. 5a. Referring to FIG. 5a, a beam 24 is incident upon a mirror 25. P-polarised light of the beam is translated by the mirror 25 upon reflection, whereas s-polarised light of the beam is not. This gives rise to an s-polarised beam 24a and a p-polarised beam 24b which are spatially separated. In FIG. 5b, the Goos-Haenchen shift at mirror 22 gives rise to an s-polarised beam 23a and a p-polarised beam 23b. However, due to the symmetry of the mirror configuration, an equal and opposite Goos-Haenchen shift occurs at mirror 21, so that the beams 23a, 23b are recombined to form a single beam 23.

It will be appreciated that there are other configurations of optics which make it possible to use two reflections to substantially eliminate the Goos-Haenchen shift. For example, two internal reflections inside a suitably dimensioned reflecting prism may be used (the prism may have any suitable number of sides).

A potential disadvantage of embodiments of the invention that use more than one reflection in such manner is that they may occupy extra space as compared to an embodiment of the invention as shown in FIG. 2.

Figure 6:
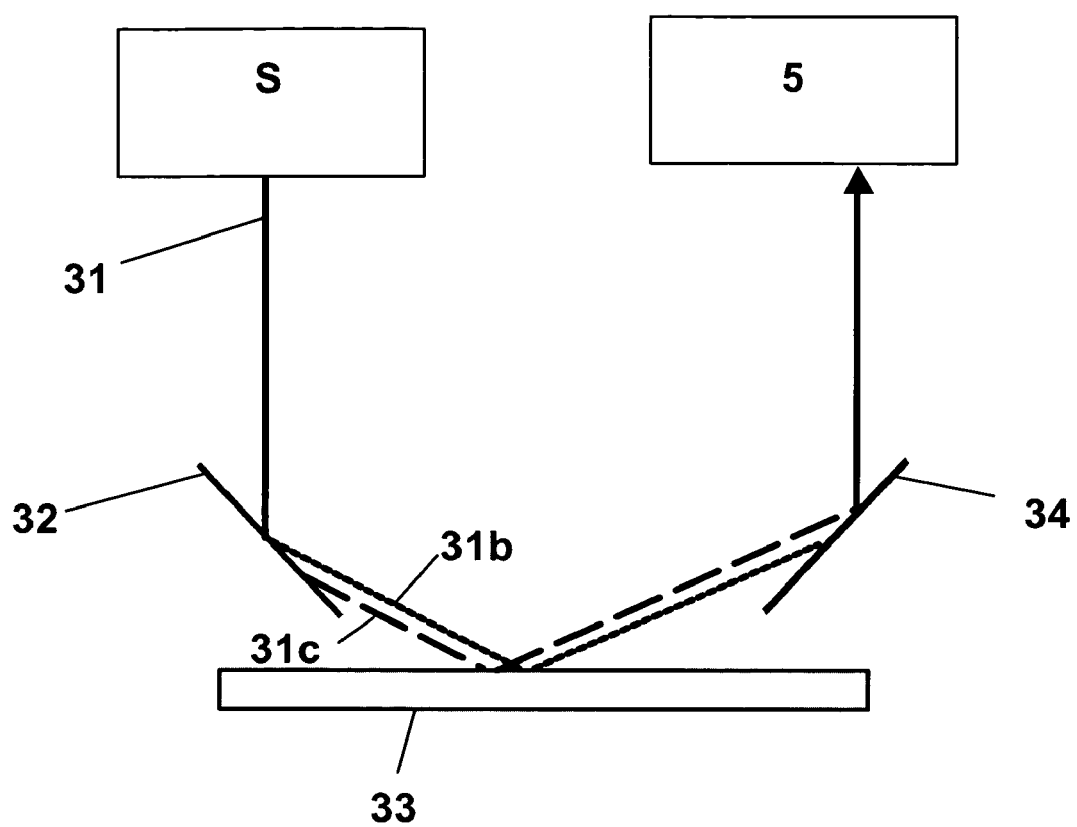
FIG. 6 depicts a level sensor according to another embodiment of the invention.

In a further alternative embodiment of the invention, a level sensor is constructed using two non-identical metallic mirrors which are chosen such that the Goos-Haenchen shift occurring at the first mirror is at least partially corrected by the Goos-Haenchen shift occurring at the second mirror, thereby leading to a minimal apparent surface depression. This is shown schematically in FIG. 6. A first mirror 32 of the level sensor gives rise to a shift of the reflection of p-polarised light 31c but not s-polarised light 31b, whereas a second mirror 34 of the level sensor gives rise to a shift of the reflection of s-polarised light 31b but not p-polarised light 31c (for simplicity of this illustration, the substrate 33 is assumed not to give rise to any shift). The net apparent surface depression caused by the mirrors 32, 34 is zero.

It will be appreciated that in practice there are many variables which may complicate the selection of two mirrors to provide a minimal net apparent surface depression (using different mirrors or identical mirrors). Variables which are independent of the mirrors include the angle of incidence of the level sensor beam on the mirrors, the wavelength range of the level sensor beam, and the polarisation state of the level sensor beam. Variables of the mirrors themselves include the number of coating layers on the mirrors and the thickness of each coating layer.

The inventors have modelled the effect of coating layer thickness for a level sensor comprising two folding mirrors based on a Ag substrate with an $Al_2O_3$ coating, in a level sensor which uses an unpolarised light beam in the wavelength range 600–1050 nm (generated by a halogen lamp). The angle of incidence of the light on the folding mirrors was 55 degrees. The level sensor performance was modelled in relation to a substrate comprising photoresist on silicon and photoresist on aluminium. The angle of incidence of the light on the substrate was 70 degrees.

For a given pair of mirror coating thicknesses, the apparent surface depression caused by the mirrors was determined for a range of resist thicknesses (200–1000 nm), first for the silicon and photoresist substrate then for the aluminium and photoresist substrate. This gave two sets of apparent surface depression values. A set of difference values was obtained by subtracting the second set from the first set, and a weighted average of the set was obtained. The model did not include apparent surface depression caused by the substrate.

Figure 7A:
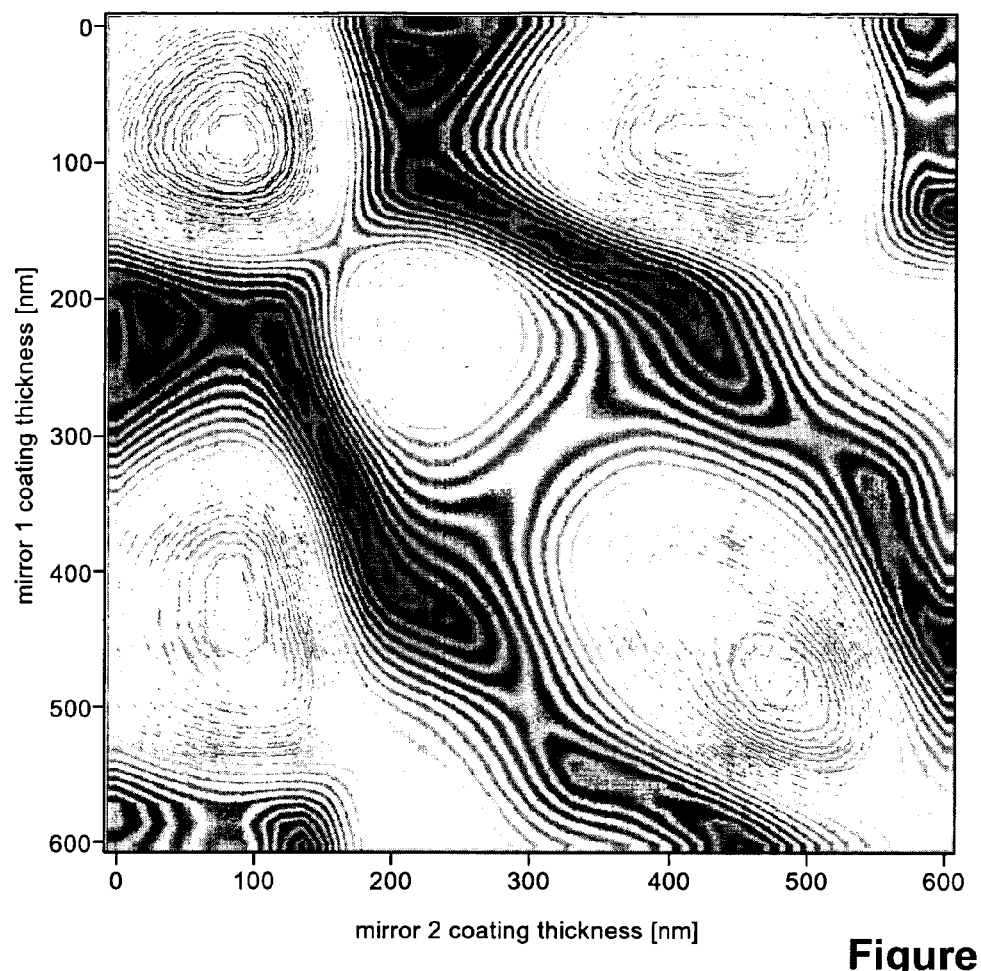
FIGS. 7, 8 and 9 are graphs which show results obtained using models which may be used to construct embodiments of the invention.
Figure 7B:
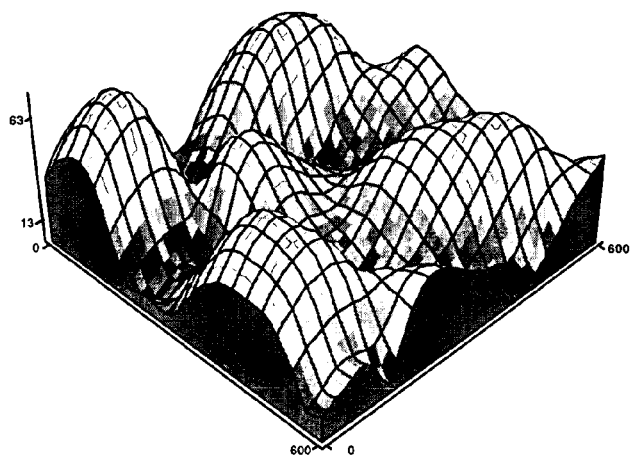

The graphs shown in FIG. 7 illustrate that the apparent surface depression exhibits maxima and minima as a function of mirror coating thickness. In FIG. 7b a peak (light grey region in FIG. 7a) is indicative of a large error, whereas a trough (dark grey region in FIG. 7a) is indicative of a small error. It can be seen from FIG. 7 that all minima are found for non-identical coating thickness combinations. Although the data shown in FIG. 7 is complex, it can be seen that in general terms a reasonably low error will be achieved provided that one of the mirrors is provided with a coating that is around 140 nm thicker or thinner than the coating of the other mirror. For example, a first mirror may have a coating which is 70 nm thick and the second mirror may have a coating which is 210 nm thick. It can be seen from FIG. 7 that variation of the coating thickness within a reasonable range will still provide a reasonably good performance. A tolerance of +/−40 nm is possible. Modern manufacturing methods allow coating thicknesses to be controlled to within 20 nm. This improved control of the coating thickness allows mirror coatings to be made which are located at the centre of an area with minimal error. Reasonable target thicknesses would be 210+/−20 nm and 70+/−20 nm.

It can be seen from FIG. 7 that a small error arises when both mirrors are provided with zero thickness (i.e. no) coatings. This error arises because the metal of the mirrors gives rise to a small Goos-Haenchen shift.

This model indicates mirror-coating thicknesses which will give rise to a minimal apparent surface depression, assuming that no apparent surface depression is caused by the substrate. In practice it is known that the substrate will always give rise to some apparent surface depression, and so this model is of limited utility. The model is however useful to determine appropriate mirror-coating thicknesses for a level sensor to be fitted in a lithographic apparatus which will be used for a wide variety of processed substrates (since it may not be possible to model the apparent surface depression caused by the substrates).

In some instances it may be known in advance that a lithographic apparatus will be used for a particular given processed substrate. Where this is the case, a model may be used to determine the thickness of mirror coatings which provides a minimal apparent surface depression, taking into account the apparent surface depression caused by the substrate.

It will be appreciated that this approach represents a significant option as compared to above embodiments. Instead of minimising or eliminating the apparent surface depression arising from mirrors, the apparent surface depression arising from the mirrors is used to counteract the apparent surface depression occurring on the substrate (i.e. the net total apparent surface depression is minimised).

The range of solutions for optimum coating stack parameters is large. The optimum choice may depend on the angle of incidence of the level sensor beam on the mirrors, the wavelength range and polarisation state of the level sensor beam, the number of coating layers on the mirrors, and/or the thickness of each coating layer. Additional variables may include the angle of incidence of the level sensor beam on the substrate, and the expected combination of materials on the substrate.

The inventors have constructed a second model, for a level sensor having two folding mirrors based on a Ag substrate with an $Al_2O_3$ coating, a level sensor beam comprising unpolarised light in the wavelength range 600–1050 nm, and a substrate comprising photoresist on silicon and photoresist on aluminium. The angle of incidence of the light on the folding mirrors was 55 degrees. The angle of incidence of the light on the substrate was 70 degrees.

Figure 8A:
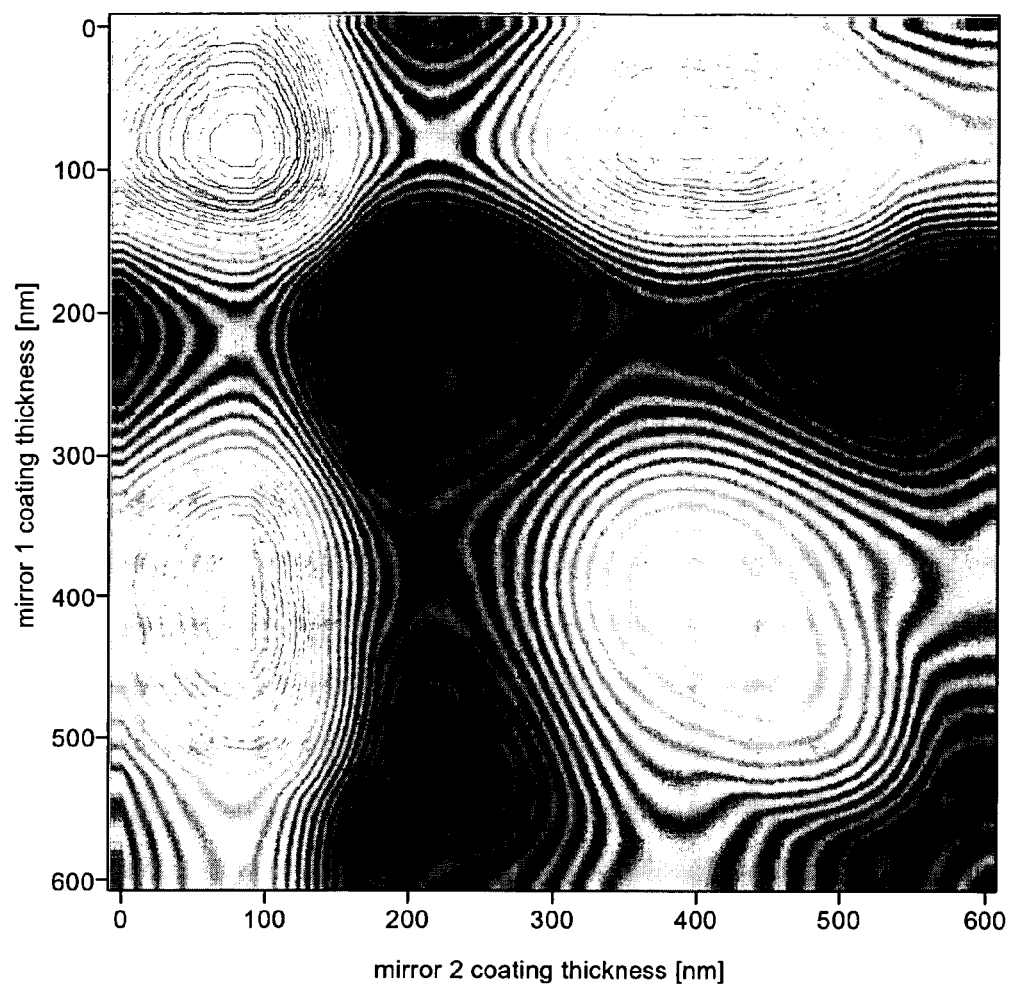
Figure 8B:
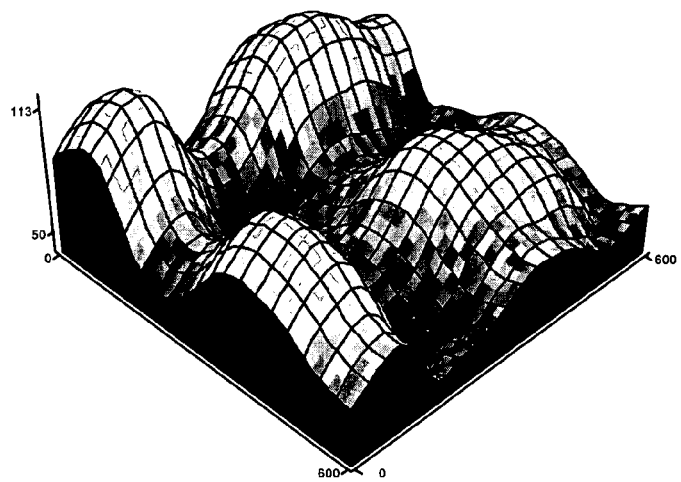

The apparent surface depression effect of mirrors and substrate was calculated averaged over a resist thickness range of 200–600 nm (the model operated in the same manner as the model described further above, except that the apparent surface depression effect of the substrate was included in the model). FIG. 8b shows the effect of varying the coating thickness of the mirrors, peaks indicating large errors and troughs indicating small errors (this is shown two-dimensionally in FIG. 8a). It can be seen from FIG. 8 that a minimal error occurs in a region centred approximately on coating thicknesses of 275 nm for both mirrors. FIG. 8 shows that the range of coating thicknesses for which a minimal error occurs is quite large, roughly 100 nm or so, and acceptable results may be expected in that area. In a preferred embodiment of the invention, the coating thickness is centred on 275 nm with a tolerance of +/−40 nm. Modern coating methods may allow the thickness to be controlled with a tolerance of +/−20 nm. Such control may be preferred because it allows the coating thicknesses to be kept close to the preferred value of 275 nm.

When looking at FIG. 8 it may seem that the choice of the preferred value of 275 nm is erroneous, since it does not correspond precisely with the minimum error. However, when selecting the preferred value it may be desirable to stay away from regions of FIG. 8 which have large gradients. This is because close proximity to a large gradient may cause a large error to occur in the event of a small change of the system, for example a small change in the thickness of the oxide layer provided on the substrate. The choice of 275 nm is optimal based on a combination of a small error and a small gradient.

It can be seen from FIG. 8 that a low error occurs in regions where one mirror has a coating thickness of approximately 275 nm and the other has a coating thickness of approximately 520 nm. This region may also be used to achieve a low error, although it may be difficult to control the thickness of the coating at 520 nm (the thicker a coating is, the harder it may be to control the thickness).

The second model was determined for a particular substrate, i.e. photoresist-on-silicon with a thickness range of 200 nm–600 nm. Where it is known that a lithographic apparatus (and the level sensor fitted to it) are to be used for this substrate, the model may be used to select appropriate mirrors for the level sensor, for example with coatings 275 nm thick. Where it is known that a lithographic apparatus (and level sensor) are to be used for a different substrate, the model may be modified to determine appropriate mirrors for the level sensor. In this way the mirrors may be tailored to be optimal for those processed substrates for which it is intended to use a given lithographic apparatus.

For reasons as mentioned above, consistency between level sensors of different lithographic apparatus of a 'family' may be important. For example, it may be desirable to minimise differences between lithographic machines (so-called machine-to-machine variations). The inventors adapted the model to measure variation of the apparent surface depression effect between two machines, as a function of the thickness of the oxide coatings on the mirrors of the level sensor. FIG. 9 shows the results generated by the model. Referring to FIG. 9 it can be seen that areas with minimal machine-to-machine error are centred on oxide thicknesses of 75 nm and 240 nm for both mirrors, or a combination of 75 nm on one mirror and 240 nm on the other mirror. The results shown in FIG. 9 are in effect $Al_2O_3$ thicknesses which are optimised for manufacturing tolerances.

Taking into account the results found from the model, as shown in FIGS. 7 to 9, it has been determined that if two mirrors with the same coating thickness are to be used, then the best thickness for the coating is 275 nm. The accuracy with which the coating thicknesses can be applied may vary from +/−40 nm to +/−20 nm.

Taking into account the results found from the model, as shown in FIGS. 7 to 9, it has been determined that if two mirrors with different coating thickness are to be used, then the difference between the thicknesses should be around 130 nm. For example, a first mirror may have a coating which is 90 nm thick and the second mirror may have a coating which is 220 nm thick. These values differ slightly from those obtained in relation to FIG. 7. This is in order to provide an improved machine-to-machine variation. The accuracy with which these coating thicknesses can be applied may vary from +/−40 nm to +/−20 nm.

Machine-to-machine variation may be improved by increasing the accuracy with which the thickness of the coating is controlled. This is another reason why well controlled thicknesses may be preferred.

As mentioned above, the preferred values of coating thickness may be dependent upon the angle of incidence of light on the folding mirrors of the level sensor, or on the angle of incidence of the light on the substrate. Both of these have been investigated using the model developed by the inventors. It was found that variation by +/−5 degrees of the angle of incidence of light on the folding mirrors (55 degrees) did not significantly modify the output of the model. Similarly, it was found that variation by +/−5 degrees of the angle of incidence of the light on the substrate (70 degrees) did not significantly modify the output of the model. It can be concluded therefore that the selection of the coatings for the mirrors is applicable for a substantial range of angles of incidence.

The preferred values of coating thickness were determined using a model based upon Ag mirrors. The inventors have substituted Al mirrors for the Ag mirrors, and have found that the preferred values of coating thickness remain the same.

The preferred values of coating thickness were determined using $Al_2O_3$. It will be appreciated that different materials may be used to provide the coating, for example silicon dioxide ($SiO_2$) or magnesium fluoride ($MgF_2$). An important property of the material is that it is transparent, i.e. sufficiently transparent at the wavelength or wavelengths generated by the light source to enable the level sensor to function correctly.

Where a material other than $Al_2O_3$ is used, the preferred values of the coating thickness should be adjusted to take account of differences of refractive index between the material used and $Al_2O_3$. In other words, the optical thickness of the oxide layer should be equivalent to that of the $Al_2O_3$ layer. The term 'optical thickness' is used herein to indicate the product of the thickness of a layer and the refractive index of the material of the layer (e.g. at a wavelength of interest). For example, the refractive index of $Al_2O_3$ is 1.57 at a wavelength of 800 nm (this is the central wavelength of the light used by a level sensor according to one embodiment of the invention). The optical thickness of a 275 nm layer of $Al_2O_3$ is therefore 275×1.57, which is 432 nm. For this example, if a material other than $Al_2O_3$ is used, the thickness of the material should be selected to provide an optical thickness of 432 nm.

A level sensor for a lithographic projection apparatus according to one embodiment of the invention comprises a light source, a first reflector, a second reflector and a detector, the first reflector being positioned to direct light from the light source towards a wafer surface, and the second reflector being positioned to direct light reflected from the wafer surface to the detector, wherein the first and second reflectors are selected to incur a minimal process dependent apparent surface depression.

The term 'light' is not limited to electromagnetic radiation in the visible spectrum, but is intended to cover electromagnetic radiation of any suitable wavelength.

The term 'configuration' is not limited to inherent physical properties of the mirrors, and may include the positions and orientations of the mirrors.

The term 'minimal' is not intended to limit embodiments of the invention to cases where the process dependent apparent surface depression is substantially zero. Instead, it is intended to mean that for a given reflector type which gives rise to a range of possible apparent surface depressions, the configuration of the reflectors is such that the apparent surface depression lies within a low portion of the range.

Embodiments of the invention have arisen from the inventors' realisation that process dependency of the apparent surface depression is not caused solely by the substrate surface, but is also caused by mirrors of the level sensor (a realisation that is counterintuitive since the mirrors are not modified in any way by wafer processing).

The minimal apparent surface depression may be a net minimum of the apparent surface depression of the combination of the first and second mirrors. Alternatively, the minimal apparent surface depression may be a net minimum of the apparent surface depression of the combination of the first and second mirrors together with the wafer surface.

A plurality of lithographic projection apparatus according to another embodiment of the invention comprises a radiation system for providing a projection beam of radiation; a support structure for supporting a patterning structure, the patterning structure serving to pattern the projection beam according to a desired pattern; a substrate table for holding a substrate; and a projection system for projecting the patterned beam onto a target portion of the substrate.

Each such lithographic apparatus further comprises a level sensor comprising a light source, a first reflector, a second reflector and a detector, the first reflector being positioned to direct light from the light source towards a wafer surface, and the second reflector being positioned to direct light reflected from the wafer surface to the detector, wherein the first and second reflectors for each level sensor are substantially identical, thereby substantially eliminating relative variation of process dependent apparent surface depression between each lithographic apparatus.

The first and second reflectors may be mirrors. The mirrors may be metallic and may be coated with a transparent material. The term 'transparent' is intended to mean sufficiently transparent, at the wavelength or wavelengths generated by the light source, to enable the level sensor to function correctly.

The material may be an oxide, a fluoride, or any other suitable material. The material may be for example $Al_2O_3$, $MgF_2$ or $SiO_2$. The material may be $Al_2O_3$ with a thickness of 275+/−40 nm, or another material having an equivalent optical thickness.

The material may be $Al_2O_3$ with a thickness of 220+/−40 nm on a first mirror and 90+/−40 nm on a second mirror. Other thicknesses may be used, with a similar difference between them. Other materials may be used, with equivalent optical thicknesses.

The mirrors may be Ag, Al, Au or other suitable metallic material. The mirrors may be Al coated with a layer of native oxide. In this context, the term 'coated' is not intended to mean that the layer of native oxide is actively applied. Instead, the layer of native oxide is passively created (e.g. by oxidation of a surface of the mirror).

The pair of reflectors may comprise two surfaces of a prism or pentaprism. The mirrors may be dielectric mirrors.

A level sensor for a lithographic projection apparatus according to a further embodiment of the invention comprises a light source, a first reflector, a second reflector and a detector, the first reflector being positioned to direct light from the light source towards a wafer surface, and the second reflector being positioned to direct light reflected from the wafer surface to the detector, wherein the reflectors are arranged in pairs, with a configuration that provides substantially zero apparent surface depression for each pair.

Whilst specific embodiments of the invention have been described above, it will be appreciated that the invention as claimed may be practiced otherwise than as described. For example, embodiments of the method may also include one or more computers, processors, and/or processing units (e.g. arrays of logic elements) configured to control an apparatus to perform a method as described herein, or a data storage medium (e.g. a magnetic or optical disk or semiconductor memory such as ROM, RAM, or flash RAM) configured to include instructions (e.g. executable by an array of logic elements) describing such a method. It is explicitly noted that the description of these embodiments is not intended to limit the invention as claimed.

The invention claimed is:

1. A lithographic apparatus comprising a level sensor configured to measure a height of a wafer surface, said level sensor comprising:
   a first reflector having at least two layers and being configured to direct a beam from a light source toward the wafer surface; and
   a second reflector having at least two layers and being configured to direct the beam from the wafer surface to a detector,
   wherein a magnitude of an apparent depression of the wafer surface due to translation of the beam at reflective surfaces of the first and second reflectors is less than thirty-five nanometers.

2. The lithographic apparatus according to claim 1, wherein a magnitude of an apparent depression of the wafer surface due to translation of the beam at reflective surfaces of the first and second reflectors is less than twenty nanometers.

3. The lithographic apparatus according to claim 1, wherein an error in the height of the wafer surface as indicated by a corresponding position of incidence of the beam at the detector is less than seventy nanometers.

4. The lithographic apparatus according to claim 1, wherein the detector is configured to indicate a height of the wafer surface based on a position of incidence of the beam.

5. The lithographic apparatus according to claim 1, wherein a sum of a translation of the beam at a surface of the first reflector, a translation of the beam at a surface of the second reflector, and a translation of the beam at the wafer surface is less than seventy-five nanometers.

6. The lithographic apparatus according to claim 1, wherein a translation of the beam at a surface of the first reflector is less than ten percent of a central wavelength of the beam.

7. The lithographic apparatus according to claim 1, wherein the first reflector includes:
   a first surface configured to direct the beam toward the wafer surface; and
   a second surface that is oriented in a same direction as the first surface, the second surface being configured to direct the beam toward the first surface.

8. The lithographic apparatus according to claim 1, wherein the second reflector includes:
   a first surface configured to direct the beam to the detector; and
   a second surface that is oriented in a same direction as the first surface, the second surface being configured to direct the beam toward the first surface.

9. The lithographic apparatus according to claim 1, wherein each among said first and second reflectors comprises a mirror.

10. The lithographic apparatus according to claim 9, wherein a reflective surface of at least one of said mirrors comprises gold.

11. The lithographic apparatus according to claim 9, wherein a reflective surface of at least one of said mirrors comprises a dielectric material.

12. The lithographic apparatus according to claim 9, wherein a reflective surface of each of said mirrors comprises a metal, and
wherein the reflective surface of at least one of said mirrors has a transparent coating.

13. The lithographic apparatus according to claim 12, wherein a reflective surface of at least one of said mirrors comprises at least one of silver and aluminum.

14. The lithographic apparatus according to claim 12, wherein said coating comprises at least one of aluminum oxide, magnesium fluoride, and silicon oxide.

15. A method comprising:
positioning a first reflector of a level sensor of a lithographic apparatus to direct a light beam from a light source toward a surface of a wafer, wherein the first reflector includes at least two layers;
positioning a second reflector of a level sensor of a lithographic apparatus to direct the beam from the surface of the wafer to a detector, wherein the second reflector includes at least two layers; and
selecting the first and second reflectors to obtain a minimum total effective translation of the beam at the surfaces of the first and second reflectors.

16. The method according to claim 15, wherein said selecting the first and second reflectors includes selecting the first and second reflectors to incur a minimal process-dependent apparent surface depression.

17. The method according to claim 15, wherein said selecting the first and second reflectors includes selecting the first and second reflectors to obtain a magnitude of an apparent depression of the surface of the wafer due to translation of the beam at reflective surfaces of the first and second reflectors of Less than thirty-five nanometers.

18. The method according to claim 15, said method further comprising:
calibrating the level sensor with respect to a wafer-processing procedure; and
applying a result of said calibrating to a height measurement obtained using a level sensor of another lithographic apparatus.

19. A lithographic method comprising:
using a first reflector of a level sensor of a lithographic apparatus to direct a light beam from a light source toward a wafer surface, wherein the first reflector includes at least two layers;
using a second reflector of the level sensor of the lithographic apparatus to direct the beam from the wafer surface to a detector, wherein the second reflector includes at least two layers; and
determining a height of the surface of the wafer based on the beam incident on the detector,
wherein a magnitude of an apparent depression of the surface of the wafer due to translation of the beam at reflective surfaces of the first and second reflectors is less than thirty-five nanometers.

20. The lithographic method according to claim 19, wherein an error in the height of the wafer surface as indicated by a corresponding position of incidence of the beam at the detector is less than seventy nanometers.

21. The lithographic method according to claim 19, wherein a total effective translation of the beam at the surfaces of the first and second reflectors is less than twenty-five nanometers.

22. The lithographic method according to claim 19, said method further comprising changing at least one of a position and an attitude of the wafer based on the determined height.

23. The lithographic method according to claim 19, said method further comprising exposing a radiation-sensitive portion of the wafer based on the determined height.

24. A lithographic apparatus comprising a level sensor configured to measure a height of a wafer surface, said level sensor comprising:
a first reflector configured to direct a beam from a light source toward the wafer surface, wherein the first reflector includes at least two layers; and
a second reflector configured to direct the beam from the wafer surface to a detector, wherein the second reflector includes at least two layers, and
wherein the first reflector and the second reflector are selected to obtain a minimum total effective translation of the beam at the surfaces of the first reflector and the second reflector.

* * * * *